United States Patent
Crabtree et al.

(10) Patent No.: US 11,628,623 B2
(45) Date of Patent: Apr. 18, 2023

(54) ADDITIVE MANUFACTURING

(71) Applicant: ADDITIVE MANUFACTURING TECHNOLOGIES LIMITED, Sheffield (GB)

(72) Inventors: Joseph Gwilliam Crabtree, Sheffield (GB); Konstantin Rybalcenko, Sheffield (GB); Andre Gaio, Sheffield (GB); Giorgio Ioannides, Sheffield (GB); Rory Evan Charlesworth, Sheffield (GB); Viktor Pap-Kovacs, Veszprem (HU)

(73) Assignee: SHAWBROOK BANK LIMITED, Essex (GB)

( * ) Notice: Subject to any disclaimer, the term of this patent is extended or adjusted under 35 U.S.C. 154(b) by 117 days.

(21) Appl. No.: 16/754,352

(22) PCT Filed: Jul. 30, 2019

(86) PCT No.: PCT/GB2019/052129
§ 371 (c)(1),
(2) Date: Apr. 7, 2020

(87) PCT Pub. No.: WO2020/025944
PCT Pub. Date: Feb. 6, 2020

(65) Prior Publication Data
US 2020/0238620 A1    Jul. 30, 2020

(30) Foreign Application Priority Data

Jul. 31, 2018   (GB) .................................. 1812476.8

(51) Int. Cl.
*B29C 64/30* (2017.01)
*B33Y 40/20* (2020.01)
(Continued)

(52) U.S. Cl.
CPC ............... *B29C 64/30* (2017.08); *B05D 1/02* (2013.01); *B05D 1/60* (2013.01); *B05D 5/06* (2013.01);
(Continued)

(58) Field of Classification Search
CPC . B05D 1/02; B05D 1/60; B05D 3/101; B05D 5/06; B05D 7/02; B29C 2071/0018;
(Continued)

(56) References Cited

U.S. PATENT DOCUMENTS

| | | | |
|---|---|---|---|
| 4,069,974 A * | 1/1978 | Zawacki | ................. B05B 14/10 239/706 |
| 4,574,092 A | 3/1986 | Gourdine | |

(Continued)

FOREIGN PATENT DOCUMENTS

| CN | 101578169 A | 11/2009 |
|---|---|---|
| CN | 102186643 A | 9/2011 |

(Continued)

OTHER PUBLICATIONS

Combined Search and Examination Report issued in corresponding EP Application No. GB1910830.7 dated Nov. 21, 2019 (7 pages).
(Continued)

*Primary Examiner* — James M Mellott
(74) *Attorney, Agent, or Firm* — Osha Bergman Watanabe & Burton LLP

(57) ABSTRACT

The present application describes apparatus (100) for colouring an additively manufactured polymer part, comprising a chamber (106) for locating at least one additively manufactured polymer part (105) to be coloured, a first reservoir (102) for containing dye pigment particles to be suspended in a gas, and fluidly coupled to the chamber, and a further reservoir (104) for containing a solvent vapour, and
(Continued)

fluidly coupled to the chamber. A method of colouring an additively manufactured polymer part is also described.

10 Claims, 3 Drawing Sheets

(51) Int. Cl.
| | |
|---|---|
| *B05D 1/00* | (2006.01) |
| *B05D 5/06* | (2006.01) |
| *B05D 7/02* | (2006.01) |
| *C23C 14/24* | (2006.01) |
| *B05D 1/02* | (2006.01) |

(52) U.S. Cl.
CPC ............... *B05D 7/02* (2013.01); *B33Y 40/20* (2020.01); *C23C 14/24* (2013.01)

(58) Field of Classification Search
CPC ... B29C 64/30; B29C 64/379; B29C 71/0009; B33Y 40/20; B33Y 80/00; C08J 2333/12; C08J 2367/04; C08J 2375/04; C08J 2377/02; C08J 7/00; C23C 14/24
See application file for complete search history.

(56) References Cited

U.S. PATENT DOCUMENTS

| | | |
|---|---|---|
| 6,713,125 B1 | 3/2004 | Sherwood et al. |
| 7,125,512 B2 | 10/2006 | Crump et al. |
| 7,236,166 B2 | 6/2007 | Zinniel et al. |
| 2003/0077404 A1* | 4/2003 | Hartley ............... B05B 13/0264 427/598 |
| 2009/0283119 A1 | 11/2009 | Moussa et al. |
| 2009/0321972 A1 | 12/2009 | Zinniel |
| 2011/0033631 A1* | 2/2011 | Malshe .................. C23C 24/00 427/458 |
| 2015/0064351 A1 | 3/2015 | Halper |
| 2015/0119238 A1 | 4/2015 | Pretsch et al. |
| 2017/0293169 A1* | 10/2017 | Braun ............... G02F 1/133606 |
| 2019/0275733 A1* | 9/2019 | Hikmet .................. B33Y 10/00 |
| 2021/0323006 A1* | 10/2021 | Singer ..................... C09D 5/26 |

FOREIGN PATENT DOCUMENTS

| | | |
|---|---|---|
| EP | 1943051 A1 | 7/2008 |
| EP | 1 501 669 B1 | 11/2010 |
| EP | 2394671 A1 | 12/2011 |
| FR | 3022250 A1 | 12/2015 |
| JP | S4818344 B | 6/1973 |
| JP | S636061 A | 1/1988 |
| WO | 2018127683 A1 | 7/2018 |

OTHER PUBLICATIONS

Search Report issued in corresponding GB Application No. 1812476.8 dated Dec. 5, 2018 (2 pages).
International Search Report issued in International Application No. PCT/GB2019/052129 dated Nov. 12, 2019 (4 pages).
Written Opinion issued in International Application No. PCT/GB2019/052129 dated Nov. 12, 2019 (10 pages).
Office Action issued in Chinese Application No. 20198004630.7, dated Jun. 10, 2021 (27 pages).

* cited by examiner

ADDITIVE MANUFACTURING

The present invention relates to additive manufacturing and in particular, but not exclusively, to colouring an additively manufactured polymer part.

Additive manufacturing (AM) is a process during which an object can be manufactured from a digital file using a layer-by-layer method without using a mould. Objects manufactured by this method usually require post-processing, including colouring. This is particularly the case for the AM polymer parts, which are generally used for aesthetic purposes. A known method of colouring AM polymer parts involves immersing the parts in a liquid including dye pigments and heating the same to a predetermined temperature. The AM parts remain immersed in the liquid until they become saturated with the dye pigment to a desired level. This requires a constant feed of freshwater and results in a significant amount of waste water contaminated with chemicals and also a significant amount of waste water contaminated with plastic microfibers that is drained away. One such colouring apparatus may consume up to 100,000 L of freshwater per year.

It is desirable for the AM parts to be coloured in a uniform, controlled and environmentally-friendly manner. Immersion in the dye pigment can to some extent colour the AM part relatively uniformly. However, due to the capillary pressure of liquids, small holes or cavities in the AM part may remain uncoloured. As such, an additional challenge is ensuring accuracy of the colouring, as the liquid immersion process described above has particularly limited control parameters. For example, it is particularly difficult to ensure repeatability and consistency of saturation of the dye pigment from one AM part to another and, in turn, consistent colouring of the AM parts.

It is therefore an aim of certain embodiments of the present invention to provide a method and apparatus for colouring an AM part in an efficient, accurate, consistent, and environmentally-friendly manner.

According to a first aspect of the present invention there is provided apparatus for colouring an additively manufactured polymer part, comprising:
- a chamber for locating at least one additively manufactured polymer part to be coloured;
- a first reservoir for containing dye pigment particles to be suspended in a gas, and fluidly coupled to the chamber; and
- a further reservoir for containing a solvent vapour, and fluidly coupled to the chamber.

Optionally, the first reservoir is directly coupled to the chamber or via the second reservoir.

Optionally, the apparatus comprises a heater to vaporise a liquid solvent contained in the second reservoir.

Optionally, the apparatus comprises a filter fluidly coupled to the chamber to recover solvent vapour and dye pigment particles exhausted from the chamber.

Optionally, the apparatus comprises a gas supply to selectively pressurise at least the first reservoir.

Optionally, the apparatus comprises a vacuum pump to create a reduced pressure in the chamber with respect to a pressure in the first reservoir and/or the second reservoir.

Optionally, the apparatus comprises a dryer to dry to a coloured polymer part.

Optionally, the apparatus comprises a controller to control the introduction of solvent vapour and dye pigment particles into the chamber and colouring of an additively manufactured polymer part located therein.

Optionally, the apparatus comprises at least one magnet configured to create a magnetic field across the chamber and a part located therein.

Optionally, the at least one magnet is selectively movable with respect to the chamber to thereby orient the magnetic field in a desired direction across the chamber and a part located therein.

According to a second aspect of the present invention there is provided a method of colouring an additively manufactured polymer part, comprising:
- locating an additively manufactured polymer part in a chamber;
- introducing dye pigment particles suspended in a gas into the chamber; and
- introducing a solvent vapour into the chamber.

Optionally, the method comprises suspending a predetermined amount of dye pigment particles in the gas in a first reservoir fluidly coupled to the chamber.

Optionally, the method comprises heating a liquid solvent in a second reservoir to cause the solvent to vaporise therein.

Optionally, the method comprises mixing the gas including dye pigment particles suspended therein with the solvent vapour.

Optionally, said mixing occurs before or in the chamber.

Optionally, the method comprises recovering solvent vapour and dye pigment particles exhausted from the chamber.

Optionally, the method comprises selectively pressurising at least the first reservoir.

Optionally, the method comprises creating a reduced pressure in the chamber with respect to a pressure in the first reservoir and/or the second reservoir.

Optionally, the method comprises drying a coloured polymer part.

Optionally, the gas is air.

Optionally, the solvent comprises at least one of the following: 1,1,1,3,3,3-hexafluoro-2-propanol (HFIP), dimethylformamide, sulphuric acid, m-cresol, formic acid, trifluoroacetic acid, 2-Methyltetrahydrofuran (Me-THF), Dimethyl sulfoxide (DMSO) and benzyl alcohol.

According to a third aspect of the present invention there is provided use of a solvent vapour and dye pigment particles suspended in a gas to colour an additively manufactured polymer part.

According to a fourth aspect of the present invention there is provided a method of disposing particles on a surface of an additively manufactured polymer part, comprising:
- locating an additively manufactured polymer part in a chamber;
- introducing a solvent vapour into the chamber to dissolve/soften a surface of the part; and
- introducing particles suspended in a gas into the chamber to adhere the same onto the surface of the part.

According to a fifth aspect of the present invention there is provided apparatus for aligning particles on a surface of an additively manufactured polymer part, comprising:
- a chamber for locating at least one additively manufactured polymer part;
- a first reservoir for containing at least partially magnetic particles to be suspended in a gas, and fluidly coupled to the chamber;
- a second reservoir for containing a solvent vapour, and fluidly coupled to the chamber; and
- at least one magnet configured to apply a magnetic field across the chamber and a part located therein.

Optionally, the at least one magnet is selectively movable with respect to the chamber to thereby orient the magnetic field in a desired direction across the chamber and a part located therein.

According to a sixth aspect of the present invention there is provided a method of aligning particles on a surface of an additively manufactured polymer part, comprising:
  locating an additively manufactured polymer part in a chamber;
  introducing a solvent vapour into the chamber to dissolve/soften a surface of the part;
  introducing at least partially magnetic particles suspended in a gas into the chamber to adhere the same onto the surface of the part;
  applying a magnetic field across the chamber; and
  aligning the particles in a direction of the magnetic field.

Optionally, the method comprising:
  selectively moving at least one magnet with respect to the chamber to thereby orient the magnetic field in a desired direction across the chamber and a part located therein.

DESCRIPTION OF THE DRAWINGS

Certain embodiments of the present invention will now be described with reference to the accompanying drawings in which.

DETAILED DESCRIPTION

Figure 1:
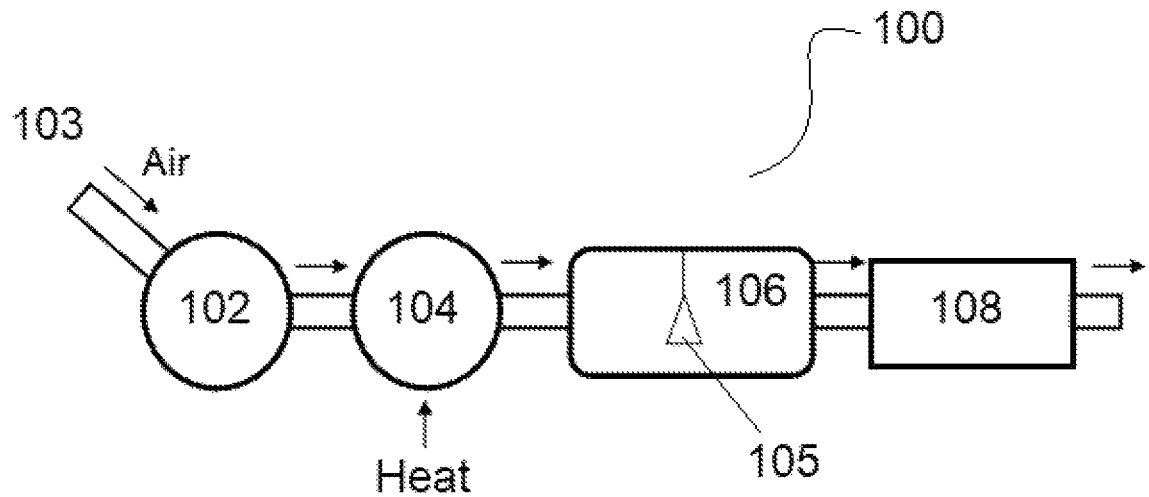
FIG. 1 illustrates apparatus according to certain embodiments of the present invention for colouring AM parts.

As shown in FIG. 1, apparatus 100 includes a particle reservoir 102 where a coloured dye pigment is stored in powder form and can be turned airborne with the help of air currents or a controlled-pressure atmosphere. An optional air supply 103 may be used to help transfer the coloured dye pigment particles from the particle reservoir 102 downstream towards an AM part processing chamber 106. The supply of air and resulting speed of flow depends on the size of the dye pigment particles and required amount of the particles to be airborne and transferred from the particle reservoir 102 towards the processing chamber 106.

Optionally, a vacuum may be applied to aid the transfer of coloured pigment particles from the dye reservoir 102 to the processing chamber 106. Optionally, the pressure difference to aid the transfer of the dye pigment particles should be between 750-400 mbar. The size of the dye pigment particles varies depending on the required colouring finish to be achieved and can be from around 3 nm for specific dye pigment nano-crystals up to around 1 mm for the coloured grain pigments. The dye pigment nano-crystals are crystalline components optionally prepared to have a specific property required for the material post-processing, i.e. to reflect only particular colour for bright-coloured finish or to exhibit an iridescent colouring effect.

Optionally, particle reservoir 102 may include other material particles, with a different function than to colour the part. The particles may comprise another polymer to the part itself, a composite material, metal, graphite, ceramic or other material. These particles would be transferred airborne with the help of a pressure difference created in the processing chamber or by a carrier gas, such as air or nitrogen.

The particle chamber 102 is fluidly coupled to a solvent heating reservoir 104 where a solvent is vaporized. The heat to the solvent reservoir 104 is supplied via an electric heating element, or the like. The amount of heat provided depends on the quantity of the solvent to be vaporised, which in turn depends on the surface area of the AM polymer parts to be coloured. Preferably, the heater should have enough energy to vaporise a given solvent within several minutes. Preferably, the heater should have at least 500 W of power, and aptly be made out of around 2 kg of stainless steel so that it would contain at least around 2 kg of thermal mass. The particle reservoir 102 may be located between the solvent heating reservoir 104 and the processing chamber 106 or have a separate connection to the processing chamber 106.

The processing chamber 106 is fluidly coupled to the solvent heating reservoir 104 wherein the solvent vapour and coloured dye particles are mixed to colour a suspended AM polymer part 105 located in the processing chamber 106. In the case reservoirs 102 and 104 are connected, the solvent vapour and coloured dye particles are mixed before entering the processing chamber 106. Alternatively, the particle reservoir 102 may be directly connected to the processing chamber 106, and the dye particles and solvent vapour may mix together in the processing chamber 106. The AM part/s may be mounted on a rack or the like located in the processing chamber 106. A filter 108 is provided to recover the solvent vapor and dye pigment particles from the air that is released from the processing chamber 106 before being exhausted to the atmosphere. The preferred processing pressure within the processing chamber 106 is between around 250-400 mbar. Aptly, the processing chamber is heatable, i.e. the interior may be controllably heated by suitable means such as one or more heating elements. This may be desirable to avoid condensation of the solvent, or any other chemical vapours, on the walls of the chamber and in turn adherence of any dye particles thereon. Aptly, the processing chamber is made out of polished stainless steel or any other material with similar properties of chemical resistance and low emissivity. Low heat emissivity ensures the parts inside the processing chamber are not impacted by the heat.

To aid the transfer of dye particles from the particle reservoir 102 to the processing chamber 106, an additional carrier gas may be added, such as nitrogen or the like. This might be desirable if colouring is performed in the controlled environment of an inert gas. Optionally, a vacuum pump (not shown) may be provided downstream of the processing chamber 106 to create a negative pressure differential to help transport the dye particles and vapor solvent into the processing chamber 106. Optionally, the same or a further vacuum pump (not shown) may be provided to create a reduced pressure environment in the processing chamber 106 to aid the part colouring process. Optionally, the coloured dye particles may be introduced straight into the processing chamber 106 via a separate inlet before being mixed with the solvent vapour in the processing chamber. Optionally, pressure and temperature transducers may be provided to monitor respective parameters during the colouring process. Optionally, a controller, such as a computing device and Programmable Logic Controller (PLC), may be provided to selectively control the colouring process.

With reference to the flow diagram of FIG. 2, a method 200 of colouring an AM polymer part will now be described. At step 202, the AM polymer part to be coloured is suspended in the processing chamber 106. One or more AM parts of various materials may be located in the processing chamber. Example materials include PA12, PA11, PA6, TPU, TPE, PLA, ABS, PMMA, ULTEM or the like, and the parts may be manufactured by a variety of different 3D printing methods, including Selective Laser Sintering, Multi Jet Fusion, High Speed Sintering and Fused Deposition Modeling, or the like.

At step 204, the solvent vapour and coloured dye particles are introduced into the processing chamber 106 either in a premixed state or to be mixed within the processing chamber. The amount of coloured dye particles and solvent vapour depends on the surface area of the AM polymer part to be coloured, and the required colour saturation. For example, for a Nylon™ 12 component with a surface area of around 1 cm$^2$, 15 ml of solvent was used and 5 g of pigment dye.

Liquid solvent is heated in the solvent heating reservoir 104 to transform the same into solvent vapour. The temperature of the heater in the solvent reservoir 104 is at least around 80° C., preferably around 100° C.

The solvent is suitable to dissolve the AM polymer material to be coloured and smooth the surface/s thereof as described for example in PCT/GB2017/053841. Suitable solvents include protonic polar solvent and non-proton polar solvents, such as, but not limited to, 1,1,1,3,3,3-hexafluoro-2-propanol (HFIP), dimethylformamide, sulphuric acid, m-cresol, formic acid, trifluoroacetic acid, 2-Methyltetrahydrofuran (Me-THF), Dimethyl sulfoxide (DMSO) and benzyl alcohol. Aptly a solvent that exhibits strong hydrogen bonding properties may be used. This property will allow the solvent to process substances that serve as hydrogen bond acceptors, such as Nylons™ (Polyamides).

At step 206, the surface of the AM polymer part/s starts to dissolve due to the presence of the solvent vapour within the processing chamber 106. The airborne dye pigment particles, which are introduced with the solvent vapour into the processing chamber 106, deposit on the AM polymer part/s and are adhered to the dissolved surface. The more dye pigment particles are introduced into the processing chamber 106, the higher colour saturation the AM polymer part will obtain. If required, the dye pigment particles are continuously being introduced into the processing chamber 106 until the AM polymer part reaches the required colour intensity/saturation. The pressure within the processing chamber 106 and the strengths of the air currents are determined, controlled and monitored to enable the dye pigment particles to become airborne and to ensure they completely cover the AM polymer part being coloured.

The colour of the dye pigment particles is selected according to the desired colour of the polymer part. Optionally, multi-coloured dye pigment particles may be introduced into the processing chamber 106. Optionally, dye pigment particles may be introduced directly into the processing chamber 106 with the aid of a pressurized air stream to be mixed with the solvent vapour in the processing chamber. The process is controllable by selectively controlling the concentration and amount of dye pigment, amount of solvent, solvent exposure time, colouring time, and optionally introduction of reduced pressure atmosphere, inert gas, heated walls and the initial temperature of the AM polymer part itself to aid the condensation of the solvent vapour. One or more of the above parameters may be sensed by suitable sensors/transducers and a respective signal fed back to a controller for monitoring and controlling purposes.

At step 208, once the required colouring effect has been achieved, the feed of coloured dye particles and the solvent vapor is stopped and the colouring process is in turn finished. The level of colouring can be monitored by the operator via a window, such as a glass lid on the processing chamber 106, and/or via a camera installed within the processing chamber 106. Optionally, the process may be automated by predetermined algorithms analysing the intensity of the colour on the AM polymer part based on images of the part captured by the camera during the colouring process.

Depending on specific requirements, more solvent vapour may be introduced without the dye particles to 'close the surface' by dissolving it again and allowing the surface to 'reflow'. In this case, a smooth and glossy surface will be obtained. In contrast, if the feed of solvent vapour is stopped at the same time as the feed of dye pigment particles (or a premix of solvent vapour and coloured dye particles), the material surface will be slightly less smooth and exhibit a matt finish.

The air present in the processing chamber 106 containing vapour solvent and dye pigment is optionally filtered through the filter 108 before being released into the atmosphere. Optionally, a recovery system may be provided between the processing chamber 106 and the filter 108 to recover solvent and dye pigment particles for re-use.

At step 210, the coloured AM part is optionally dried in an oven, if required. This may help to recover the remaining solvent from the part and harden the surface thereof. Control of the drying step may desirably avoid continued processing of an AM polymer part which would otherwise occur due to the presence of unevaporated solvent on the part's surface.

The processing method according to certain embodiments of the present invention may desirably seal the surface of porous materials, such as TPU and Polyamide 12, which might be advantageous where the AM part is to be used in water-sealing applications or where water tightness of the material is particularly important. This particle surface sealing effect may in turn have further applications in water-sealing applications. The processing method according to the present invention may also desirably improve the tensile strength of the AM polymer part/s.

Figure 3:
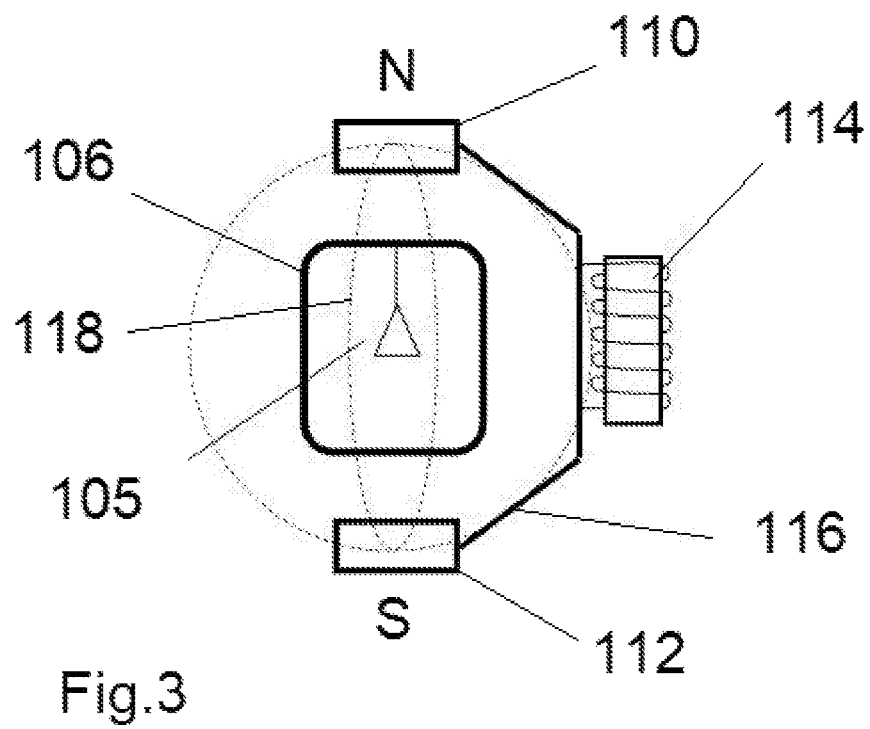
FIG. 3 illustrates an alternative embodiment of the apparatus for aligning magnetic particles using a rotating magnet.

Optionally, as illustrated in FIG. 3, the apparatus 100 may include a pair of opposed magnets 110,112 located externally of the processing chamber 106 and selectively rotatable by a magnet controller 114 in all directions around the chamber. Each magnet is aptly mounted to an arm 116 which is rotatably mounted to a support proximal to the chamber and/or to the chamber itself. A motor or the like selectively rotate the arms and the respective magnets with respect to the chamber until a desired location of the magnets is reached. The magnet controller 114 selectively energises the magnets to create a magnetic field 118 through and across the interior chamber in a desired direction subject to the location of the magnets. The magnets may be used when the particles disposed on the surface of the AM part comprise, for example, a magnetised metal, which may be used instead of, or in combination with, the dye pigment particles and when there is a requirement to align these particles in a particular direction on the surface of the material, such as to create a specific surface effect.

Figure 4A:
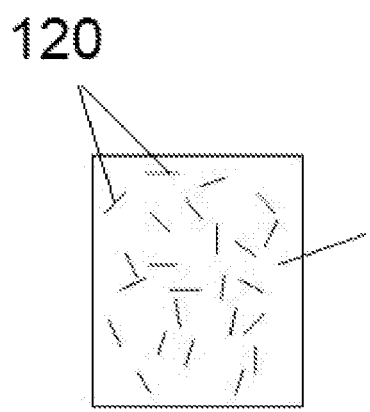
FIGS. 4a and 4b illustrate a comparison between randomly deposited particles and magnetically aligned particles in accordance with certain embodiments of the present invention.
Figure 4B:
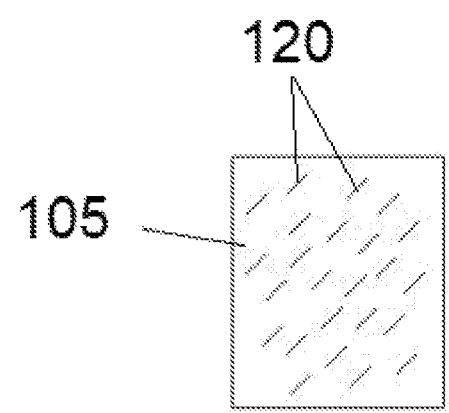

As illustrated in FIG. 4a, the particles 120 are deposited on the surface of the part 105 in a random orientation. Desirably, in accordance with certain embodiments of the present invention, the particles 120 are selectively aligned using the magnets 110,112 to a desired/required direction whilst being suspended in a liquefied/softened polymer matrix before being fixed in position when the polymer solidifies (as illustrated in FIG. 4b).

Figure 5A:
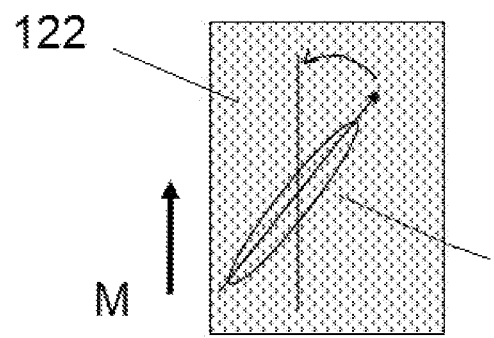
FIGS. 5a and 5b illustrate the movement of magnetic particles within a liquefied polymer matrix when being aligned according to certain embodiments of the present invention.
Figure 5B:
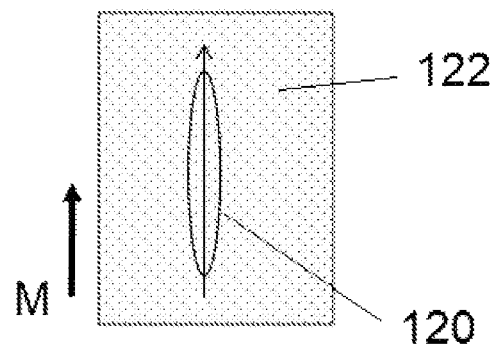

The relationship between the magnetic particles, polymer matrix and the magnetic field is illustrated in FIGS. 5a and 5b. As illustrated in FIG. 5a, each magnetic particle 120 is rotated using the magnetic field created by the magnets 110,112 to the required direction (as indicated by arrow M) whilst being adhered to/suspended in the liquefied/softened polymer matrix 122 proximal the surface of the polymer part. Solidification of the dissolved polymer matrix, e.g. by drying, fixes the particles in the desired/required position, as illustrated in FIG. 5b.

Figure 2:
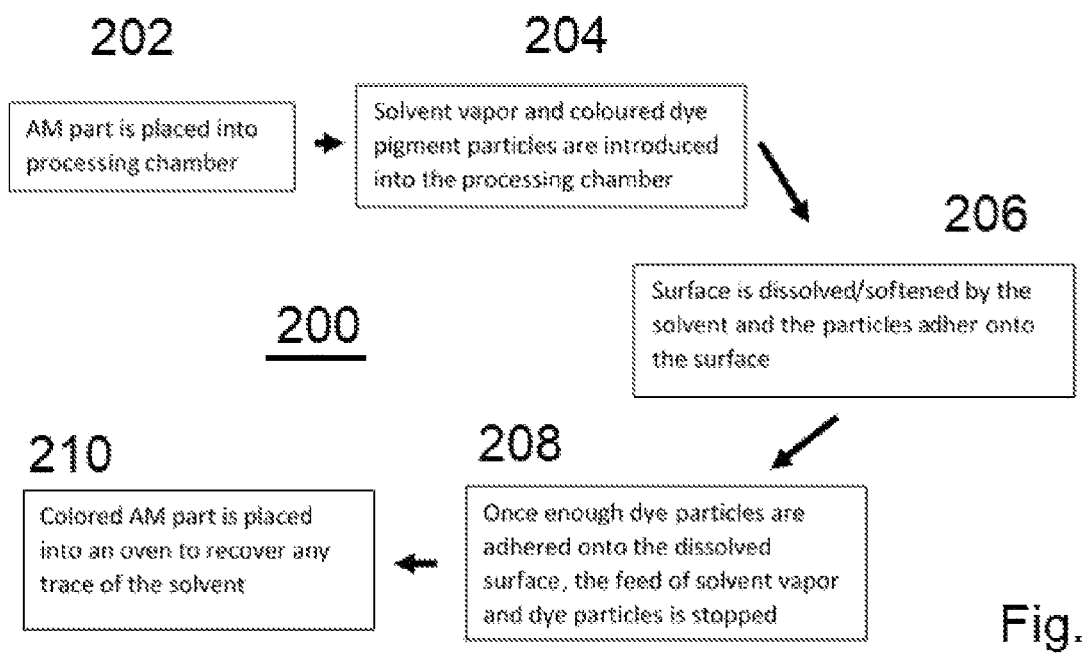
FIG. 2 illustrates a method according to certain embodiments of the present invention for colouring AM parts.

The procedure of aligning the metallic particles on the surface of the part follows the methodology described in FIG. 2. However, after step 208, once a desired amount/number of magnetic particles has been disposed onto the softened surface of the polymer part, such as to fully or partially cover the surface, the magnets 110,112 outside the processing chamber 106 are controllably rotated with respect to the part to the required position and the magnetic field is created. The magnetic particles are disposed on/suspended in the softened gel-like polymer so are able to freely rotate to a desired orientation when subjected to the magnetic force created by the magnets. The part is then dried while in the chamber under the magnetic field. This solidifies the surface polymer and locks the aligned magnetic particles in the desired position and orientation.

The drying may be done by heating up the chamber, reducing the chamber pressure and/or circulating air through the chamber to help vaporise the chemical used for dissolution of the polymer and thus to solidify the surface of the material. The part may then be placed in the oven, as at step 210, to complete the drying cycle.

Controllably aligning a coating applied to a polymer part, wherein the coating comprises magnetic or at least partly magnetic particles, or particles containing magnetic components, desirably functionalises the part surface and opens up new opportunities and applications for 3D printed components.

Figure 6A:
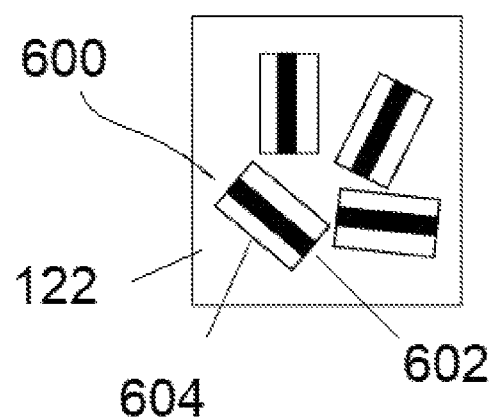
FIGS. 6a and 6b illustrate magnetic particles according to certain embodiments of the present invention before and after alignment.
Figure 6B:
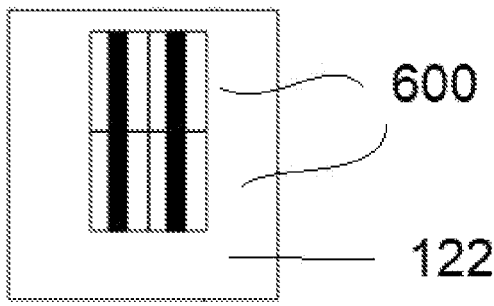

An example of using magnetic alignment in accordance with certain embodiments of the present invention to functionalise the surface of an AM polymer part is illustrated in FIGS. 6a and 6b. Particles 600 each comprise a micro magnetic element 602, such as a cylinder-shaped rod 602, coated with a non-magnetic, non-conductive layer/s 604. Aptly, the magnetic element 602 comprises a metal and the outer layer may aptly comprise a plastic or polymer and may be coloured to provide the part with a desired appearance. When first deposited randomly on the part surface 122, as illustrated in FIG. 6a, the particles 600 do not create a functional (e.g. electro-conductive) layer on the part. However, once aligned and fixed on the surface of the part in accordance with certain embodiments of the present invention, as illustrated in FIG. 6b, these particles create an insulated inner-functional (e.g. conductive) layer around the polymer part. This method of functionalising 3D printed polymer components opens up new possibilities in battery technology, capacitor technology and other electronic applications.

Certain embodiments of the present invention provide a method and apparatus for colouring an AM polymer part in an accurate, uniform and consistent manner. The method involves simultaneously covering an AM polymer with solvent vapour and airborne coloured dye particles. The solvent vapour dissolves the surface of the AM part, whereas the dye pigment particles are deposited and adhered on the part surfaces and fused together within the material.

The process is controllable to achieve a desired colouring and smoothness of an AM polymer part. Fusion of the dye particles and the material means the colour will remain intense and the AM part will not lose its colour due to UV radiation, weathering and/or leaching when in contact with other liquids.

Furthermore, the AM polymer part colouring method according to certain embodiments of the present invention does not require water for the process. Any emissions produced are in the form of vapors which can be captured with carbon filters and/or may be recovered using a condenser making the whole process closed loop, emitting only clean air. Certain embodiments of the present invention are therefore environmentally friendly.

Certain embodiments of the present invention provide a method and apparatus for disposing particles, such as coloured dye pigment particles, particles comprising a different polymer to the part itself, composite particles, metal particles, graphite particles, ceramic or other material particles, or the like, on the dissolved/softened surface of an AM polymer part in a desired manner and solidifying that surface to achieve a desired appearance and/or function.

Certain embodiments of the present invention provide a method and apparatus for functionalising the surface of a polymer AM part by coating it with one or more layers comprising at least partially magnetic particles and controllably aligning the particles in a desired orientation to thereby 'functionalise' the surface of the AM part. For example, aligning at least partially magnetic dye pigment particles in a particular direction may aptly provide a particularly desirable appearance, e.g. colour, when viewed from a particular angle/s. Furthermore, providing an AM part with an at least partially magnetic surface aptly allows the part to be used in an electronic or medical application for example. In addition, aligning the particles at the surface of an AM part aptly provides a relatively strong shell to the part which may aligned to provide strength/stiffness in a particular direction depending on the application/loading of the part in use.

The invention claimed is:

1. A method of colouring an additively manufactured polymer part, comprising:
   locating an additively manufactured polymer part in a chamber;
   providing a liquid solvent in a solvent reservoir;
   heating the liquid solvent in the solvent reservoir to cause the liquid solvent to vaporise to produce a solvent vapour within the solvent reservoir;
   introducing the solvent vapour from the solvent reservoir into the chamber;
   dissolving or softening a surface of the additively manufactured polymer part located within the chamber using the solvent vapour to create a dissolved or softened surface;
   introducing dye pigment particles into the chamber, wherein the dye pigment particles introduced into the chamber are suspended in a gas or in said solvent vapour; and
   adhering the dye pigment particles onto the dissolved or softened surface of the additively manufactured polymer part whereby, upon adhering to the dissolved or softened surface, the dye pigment particles serve to colour the dissolved or softened surface of the additively manufactured part.

2. The method according to claim 1, comprising providing a particle reservoir, said particle reservoir being fluidly coupled to the chamber, and suspending the dye pigment particles in a gas within the particle reservoir prior to said dye pigment particles being introduced into the chamber.

3. The method according to claim 2, wherein the step of introducing dye pigment particles into the chamber comprises selectively pressurising the particle reservoir so as to cause the dye pigment particles contained therein to transfer into the chamber.

4. The method according to claim 2, wherein the chamber and the particle reservoir are each held at a respective pressure, and wherein the method further comprises reducing the pressure in the chamber such that the pressure in the chamber is less than the pressure in the particle reservoir so as to cause the dye pigment particles contained within the particle reservoir to transfer into the chamber.

5. The method according to claim 1, wherein, after the introduction of the solvent vapour and the dye pigment particles into the chamber, the chamber contains a mixture of air, the solvent vapour, and the dye pigment particles; and wherein the method further comprises passing said mixture through a recovery system so as to recover the solvent vapour and the dye pigment particles from the mixture, and then, after the solvent vapour and the dye pigment particles have been recovered, releasing the remaining air into the atmosphere.

6. The method according to claim 1, wherein the chamber and the solvent reservoir are each held at a respective pressure, and wherein the method further comprises reducing the pressure in the chamber such that the pressure in the chamber is less than the pressure in the solvent reservoir so as to cause the solvent vapour contained within the solvent reservoir to transfer into the chamber.

7. The method according to claim 1, wherein the solvent comprises at least one of the following: 1,1,1,3,3,3-hexafluoro-2-propanol (HFIP), dimethylformamide, sulphuric acid, m-cresol, formic acid, trifluoroacetic acid, 2-Methyltetrahydrofuran (Me-THF), Dimethyl sulfoxide and benzyl alcohol.

8. A method of disposing dye pigment particles onto a surface of an additively manufactured polymer part, comprising:

locating an additively manufactured polymer part in a chamber;

introducing a solvent vapour into the chamber;

dissolving or softening a surface of the additively manufactured polymer part located within the chamber using the solvent vapour to create a dissolved or softened surface; and introducing dye pigment particles into the chamber, wherein the dye pigment particles introduced into the chamber are suspended in a gas or in said solvent vapour; and adhering the dye pigment particles onto the dissolved or softened surface of the additively manufactured polymer part whereby, upon adhering to the dissolved or softened surface, the dye pigment particles serve to colour the dissolved or softened surface of the additively manufactured part.

9. A method of aligning particles on a surface of an additively manufactured polymer part, comprising:

locating an additively manufactured polymer part in a chamber;

introducing a solvent vapour into the chamber to dissolve/soften a surface of the additively manufactured polymer part;

introducing at least partially magnetic particles suspended in a gas into the chamber to adhere the at least partially magnetic particles onto the surface of the additively manufactured polymer part, wherein the at least partially magnetic particles are initially deposited onto the surface of the additively manufactured polymer part in a random orientation;

applying a magnetic field across the chamber whilst the particles are suspended in the softened surface of the additively manufactured polymer part so as to align the randomly orientated particles into a desired orientation in the direction of the magnetic field; and allowing the softened surface of the additively manufactured polymer part to solidify so as to fix the at least partially magnetic particles in the desired orientation.

10. The method according to claim 9, comprising selectively moving at least one magnet with respect to the chamber to thereby orient the magnetic field in a desired direction across the chamber and a part located therein.

* * * * *